United States Patent [19]
Fuse

[11] Patent Number: 6,108,214
[45] Date of Patent: Aug. 22, 2000

[54] MOUNTING STRUCTURE OF SUPERCONDUCTING CIRCUIT

[75] Inventor: Masashi Fuse, Nisshin, Japan

[73] Assignee: Advanced Mobile Telecommunication Technology, Inc., Nisshin, Japan

[21] Appl. No.: 09/222,923

[22] Filed: Dec. 30, 1998

[30] Foreign Application Priority Data

Jun. 5, 1998 [JP] Japan .................................. 10-157845

[51] Int. Cl.$^7$ ...................................................... H05K 9/00
[52] U.S. Cl. ........................ 361/818; 361/715; 361/718; 361/728; 361/730; 361/735; 361/752; 361/753; 361/751; 361/762; 361/790; 361/799; 361/800; 361/816; 361/818; 361/141; 439/76.1; 174/35 R; 174/51; 174/125.1
[58] Field of Search ..................................... 361/718, 719, 361/724, 728, 730, 735, 746, 750–753, 762, 764, 783, 790, 795–797, 799, 800, 810, 816, 818, 141; 439/76.1; 474/51, 35 R, 125.1

[56] References Cited

U.S. PATENT DOCUMENTS

| | | | |
|---|---|---|---|
| 3,603,945 | 9/1971 | Beers et al. ............................. | 361/752 |
| 4,571,663 | 2/1986 | McPherson ............................. | 361/735 |
| 4,821,150 | 4/1989 | Duthie et al. ........................... | 361/736 |
| 5,786,986 | 7/1998 | Bregman et al. ....................... | 361/719 |

OTHER PUBLICATIONS

Scharen et al., "Filter Subsystems for Wireless Communications", IEEE Transactions on Applied Superconductivity, vol. 7, No. 2, Jun. 1997.

*Primary Examiner*—Jeffrey Gaffin
*Assistant Examiner*—Tuan Dinh
*Attorney, Agent, or Firm*—Pillsbury Madison & Sutro LLP

[57] ABSTRACT

Plural units each composed of a metallic frame and a dielectric substrate mounted on the frame are stacked on one another, thereby forming a unitary case. A superconducting circuit such as a resonator is formed on an upper surface of the substrate, and a ground plane, made of a metallic material, preferably, a superconducting material, is formed on a lower surface of the substrate. The ground plane is exposed to a center opening of the frame, so that the ground plane of one substrate faces the superconducting circuit of another substrate which is stacked underneath the one substrate with a space therebetween. Thus, a plurality of the superconducting circuits are mounted in a compact unitary case.

12 Claims, 9 Drawing Sheets

MOUNTING STRUCTURE OF SUPERCONDUCTING CIRCUIT

CROSS-REFERENCE TO RELATED APPLICATION

This application is based upon and claims benefit of priority of Japanese Patent Applications No. Hei-10-157845 filed on Jun. 5, 1998, the content of which is incorporated herein by reference.

BACKGROUND OF THE INVENTION

1. Field of the Invention

The present invention relates to a structure for mounting a substrate carrying a superconducting circuit such as a superconducting filter circuit thereon.

2. Description of Related Art

An example of a conventional mounting structure of a superconducting filter circuit is shown in FIG. 11. A filter substrate 101 made of a dielectric material carries a resonator pattern 102 made of a superconductor and formed on its upper surface and a ground plane 103 also made of a superconductor and formed on its lower surface. A gold film electrode 104 is formed on the ground plane 103. The filter substrate 101 is fixed on a base plate 106 made of copper by conductive paste 105 and covered by a cover 107 made of aluminum. Thus, a filter 100 is constituted.

When the filter 100 is operated, a cold head 109 is attached to the filter 100 via a heat dissipation plate 108, and the filter 100 is contained in a container 110 which is kept at a low temperature under vacuum. The filter substrate 101 is cooled down by the cold head 109 and kept at a cryogenic temperature. The cold head 109 is made of a material having a low heat conductivity and a high mechanical strength, such as titanium or stainless steel. The cold head 109 is a cylinder having a very thin thickness, and helium gas of about 20 atm is filled in the cylinder. The cylinder thickness is several tens micrometers, which is the minimum to endure the pressure of helium gas. Input/output terminals (not shown) of the superconducting filter are connected to a connector mounted on the base plate 106. The connector on the base plate 106 is further connected to another connector mounted on the container 110 through a coaxial cable, thereby making an electric connection between the superconducting filter and an outside circuit.

In case a multi-channel circuit having several filters 100 is required, the several filters 100 are contained in a single low temperature container 110 as shown in FIG. 12. Each filter 100 is disposed in the container 110 and connected to the cold head 109 through a heat conductive member 111. In this structure, since the cold head 109 has to carry plural heat conductive members 111 thereon, the weight thereof imposes a heavy load on the cold head. Moreover, a large refrigerator having a high capacity is required in this structure.

SUMMARY OF THE INVENTION

The present invention has been made in view of the above-mentioned problem, and an object of the present invention is to provide a simple and novel structure for mounting plural substrates each having a superconducting circuit such as a resonator on a case. Another object of the present invention is to provide the mounting structure which is small in size and light in weight, or high in mounting density, while attaining a high performance of the superconducting circuit.

According to the present invention, plural substrates each having a superconducting circuit formed thereon are stacked together with a space therebetween, forming a unitary case which is cooled down as a whole by a cold head attached thereto. A superconducting circuit such as a resonator is formed on an upper surface of the substrate made of a dielectric material, and a ground plane made of a conducting material, preferably a superconductor, is formed on a lower surface of the substrate. The substrate is mounted on a frame made of a metallic material such as copper or aluminum. The frame has an opening, and the substrate is mounted on the frame so that the ground plane is exposed to the opening. The substrate and the frame constitute a unit. When the plural units are stacked together, forming a unitary case, the ground plane of one substrate faces, with a space, the superconducting circuit of another substrate which is stacked below the one substrate. Thus, the plural substrates can be mounted with a high density, and each superconducting circuit can be properly shielded by the ground plane.

The plural substrates each having a superconducting circuit formed thereon may be mounted on or contained in a box-like case. Plural frames are formed along walls of the case with intervals therebetween, and each substrate is mounted on each frame, so that the ground plane of one substrate faces the superconducting circuit of another substrate located underneath the one substrate.

The substrate is mounted on the frame so that the ground plane of the substrate closely contacts the frame electrically and thermally. To further enhance the close contact, a soft metal foil such as a gold foil may be interposed between the substrate and the frame. When the ground plane is made of a superconducting material, the space between two substrates can be reduced without adversely affecting performance of the superconducting circuit. Rather, a jumped coupling in superconducting patterns is reduced. The lower most frame carrying the substrate thereon may be made differently from other frames, i.e., the opening of the lower most frame may be eliminated to utilize that frame also as a shielding member. A shielding layer may be formed on an upper surface of the upper most substrate to further enhance shielding effect. Connector plates for mounting connectors thereon and recessed spaces may be formed on the frame, so that the connector plates of one frame are accommodated in the recessed spaces of another frame mounted above the one frame when the frames are stacked together.

Other objects and features of the present invention will become more readily apparent from a better understanding of the preferred embodiment described below with reference to the following drawings.

DETAILED DESCRIPTION OF THE PREFERRED EMBODIMENT

Figure 1:
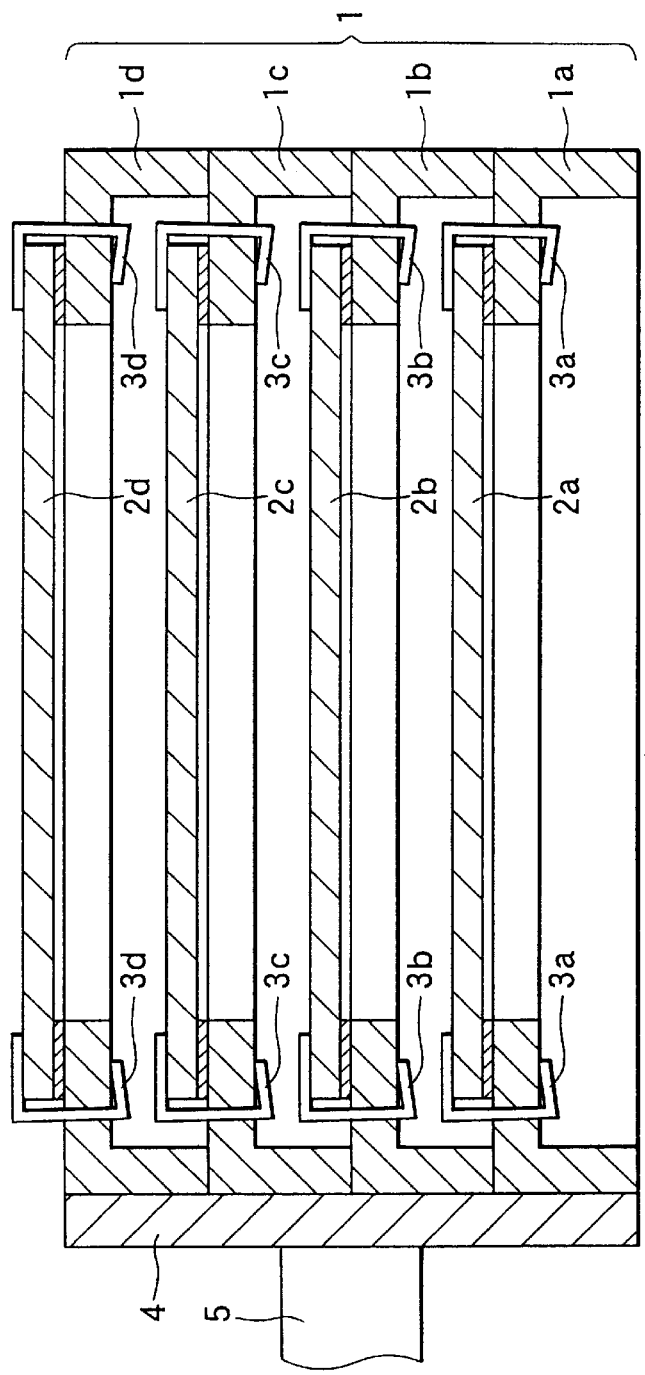
FIG. 1 is a cross-sectional view showing a structure for mounting plural superconducting filters according to the present invention.

Referring to FIGS. 1–4, a mounting structure of a superconducting filter circuit according to the present invention will be described. A substrate 2a on which a superconducting filter circuit is formed is mounted on a frame 1a by a mounting spring 3a, constituting a first filter unit. In the same manner, a substrate 2b is mounted on a frame 1b by a mounting spring 3b, constituting a second filter unit. A substrate 2c is mounted on a frame 1c by a mounting spring 3c, constituting a third filter unit. A substrate 2d has no superconducting filter circuit formed thereon, as opposed to other substrates 2a, 2b, 2c. The substrate 2d is mounted on a frame 1d by a mounting spring 3d, constituting a cover plate. The first, second and third filter units and the cover plate are all stacked on one another and connected as a single case 1 by through bolts (not shown). A heat dissipation plate 4 is fixedly attached to a side of the case 1. A cold head 5 for cooling the case 1 is connected to the heat dissipation plate 4.

Figure 2:
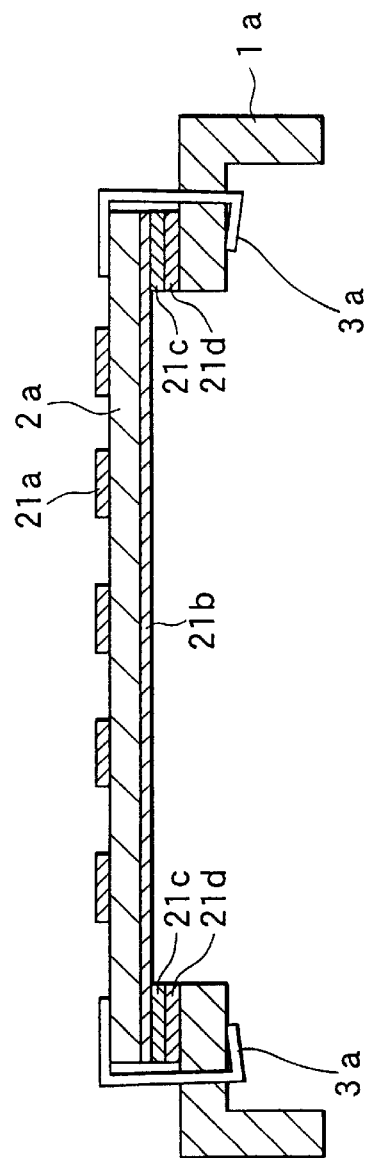
FIG. 2 is a cross-sectional view showing a unit consisting of a substrate carrying a superconducting filter thereon and a frame on which the substrate is mounted.
Figure 3:
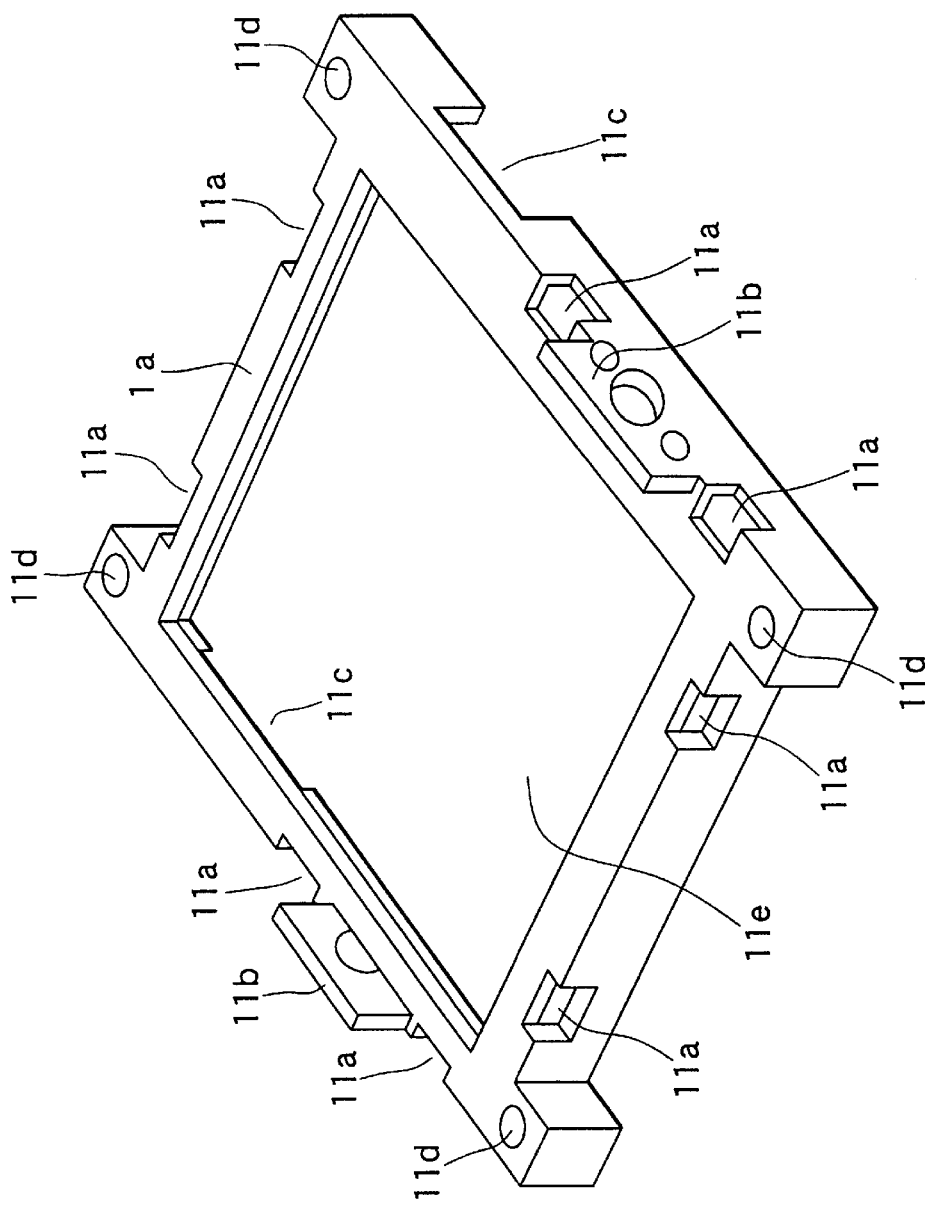
FIG. 3 is a perspective view showing the frame for mounting the substrate thereon.
Figure 4:
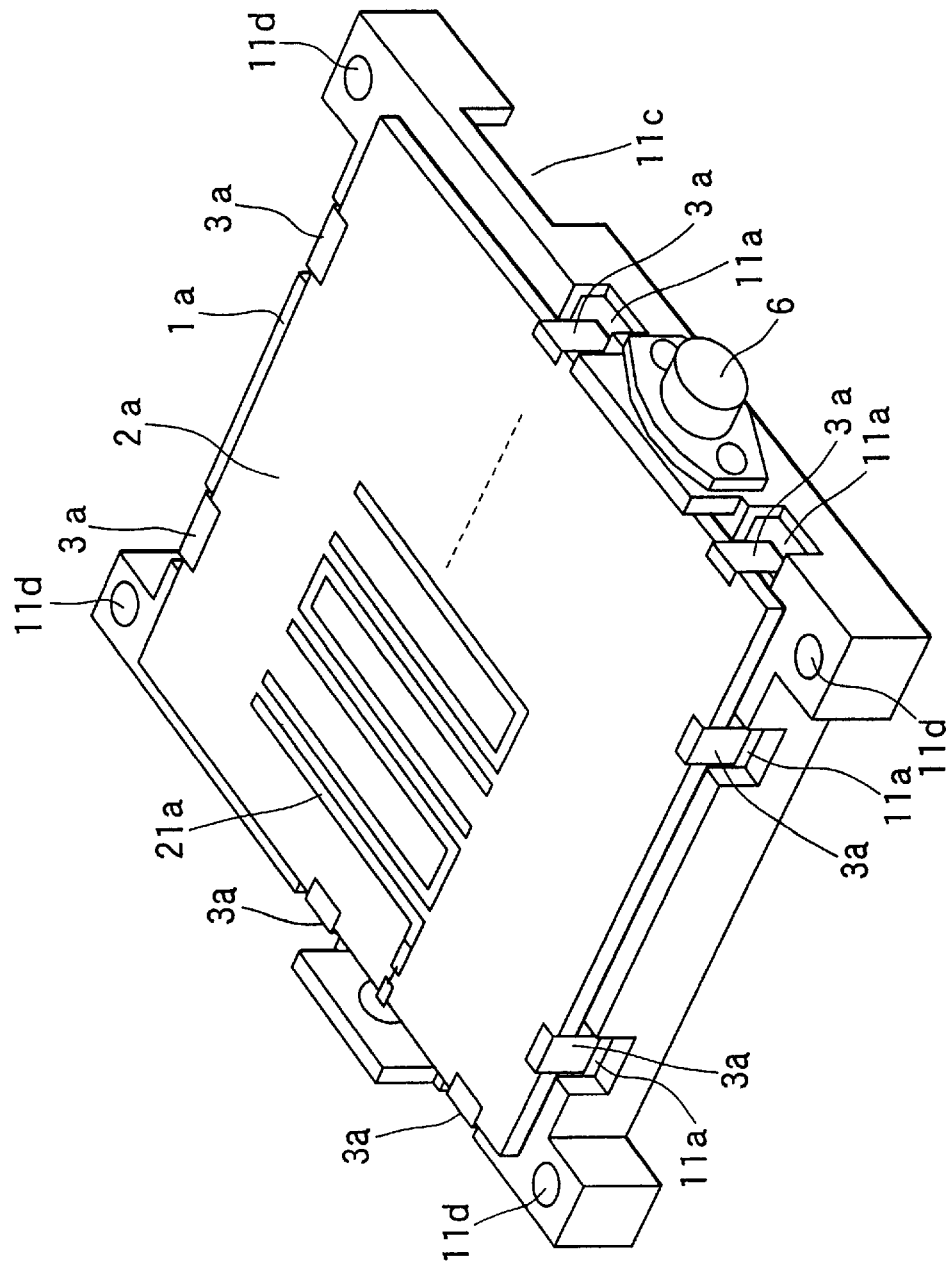
FIG. 4 is a perspective view showing one unit consisting of a frame and a substrate mounted on the frame.

Referring to FIGS. 2, 3 and 4, the first filter unit will be described in detail as a representative, since the three filter units (the first, second and third) have a same structure. As shown in FIG. 3, the frame 1a is a square frame having an opening 11e and a frame portion around its periphery. The substrate 2a is also square and mounted on the frame 1a as shown in FIG. 4. As shown in FIG. 2, a resonator pattern 21a is formed on the upper surface of the substrate 2a, and a ground plane 21b is formed on the lower surface of the substrate 2a. The resonator pattern 21a and the ground plane 21b are made of a superconducting material, and the substrate 2a is made of a dielectric material such as magnesia (MgO). A noble metal (e.g., gold) electrode film 21c is formed on the ground plane 21b at its periphery where the ground plane contacts the frame 1a. The gold electrode film 21c is formed by mask vapor deposition or sputtering. A soft metal (e.g., gold) foil 21d is interposed between the gold electrode film 21c and the frame 1a. The substrate 2a carrying the resonator pattern 21a and the ground plane 21b is fixedly mounted on the frame 2a by the mounting spring 3a. The frame 1a is made of aluminum or copper on which gold is plated. The mounting spring 3a is made of beryllium-copper. The interposed soft metal foil 21d increases a contact area between the ground plane 21b and the frame 1a, and thereby enhances heat and electric conductivity therebetween. The fastening pressure of the mounting spring 3a is set at about several tens times of the weight of the substrate, so that the fastening pressure is less than a stress caused by thermal expansion coefficient difference between the frame 1a and the substrate 2a.

FIG. 3 shows a perspective view of the frame 1a which is square or rectangular-shaped and has the opening 11e and the frame portion at its periphery. A plurality of recesses 11a are formed on the frame 1a for inserting and mounting the mounting spring 3a. Connector plates 11a are also formed on the frame 1a for mounting connectors 6 (shown in FIG. 4) at two sides of the frame 1a. Recessed spaces 11c for accommodating the connector plates 11b therein formed on the other frame to be stacked underneath. Actually, the frame 1b which has a same structure as the frame 1a is rotated 180 degrees and stacked on the frame 1a. A through-hole 11d for inserting a through-bolt for assembling the frames is formed at each corner of the frame 1a.

As shown in FIG. 4, the substrate 2a having the resonator pattern 21a and the ground plane 21b is mounted on the frame 1a by six mounting springs 3a (two each located at each side of the frame 1a). The soft metal foil 21d is interposed between the ground plane 21b and the frame 1a at each place where the mounting spring 3a is located. Two SMA connectors 6 are connected to both sides of the frame 1a by screws. An input/output terminal of the resonator pattern 21a is connected to the SMA connector as shown in FIG. 4 by wire-bonding or ribbon-bonding.

The second and the third unit having the same structure as the first unit shown in FIG. 4 are stacked on the first unit, and the cover plate is stacked on the top. Then, three units and the cover plate are connected together by through-bolts, forming a unitary case 1 shown in FIG. 1. All the ground planes formed on the lower surface of each filter unit and the cover plate are electrically connected to all four frames 1a–1d which in turn are grounded through the heat dissipation plate 4 and the cold head 5. Each ground plane 21b formed on the lower surface of each substrate and the cover plate is open through the opening 11e of each frame. Accordingly, each resonator pattern 21a faces a respective ground plane 21b with a certain space therebetween. That is, the resonator pattern 21a of the first unit faces the ground plane 21b of the second unit, the resonator pattern 21a of the second unit faces the ground plane 21b of the third unit, and the resonator pattern 21a of the third unit faces the ground plane 21b of the cover plate. Thus, each resonator pattern 21a and a ground plane 21b located above the resonator pattern 21a form a so-called covered microstrip line.

Figure 11:
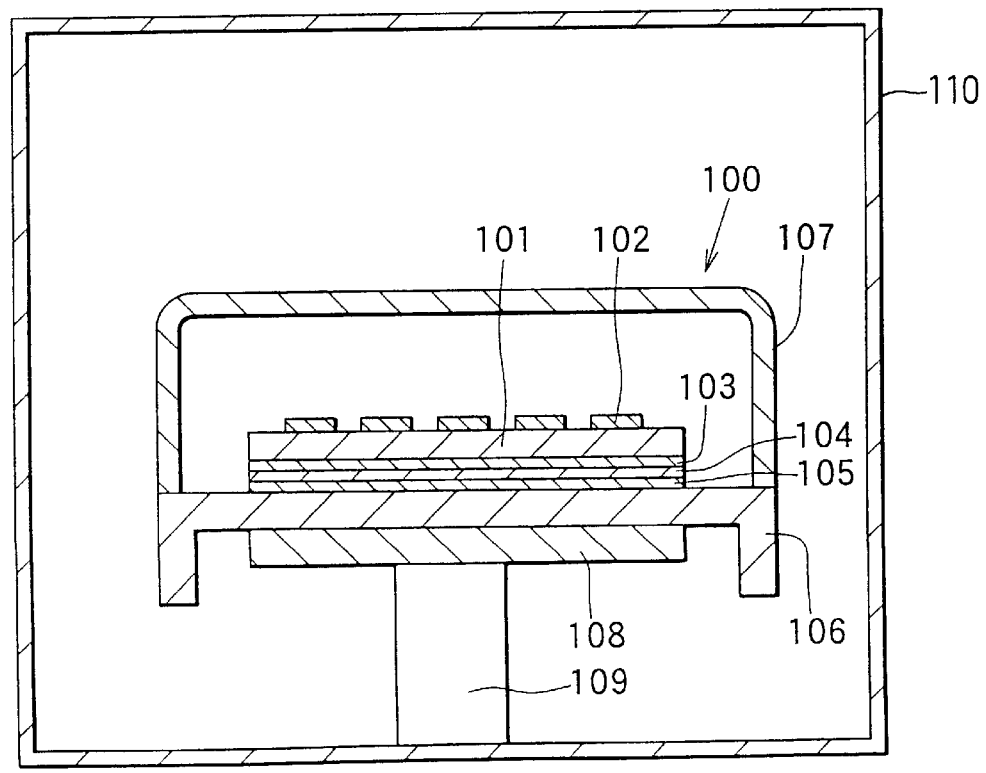
FIG. 11 is a cross-sectional view showing a conventional structure for mounting a superconducting filter.

The superconductor ground planes 21b formed on each substrate serve to shield filters from one another. The shielding effect is further enhanced because each ground plane 21b is electrically connected to each frame with a low impedance through the gold electrode film 21c and the soft metal foil 21d. Generally, induction current induced on a grounded conductor located above a resonator pattern causes a loss. However, in this embodiment, the loss is considerably reduced because a superconductor is used as the grounded conductor and its surface resistance is very low. Moreover, the spaces between substrates 2a–2d can be considerably reduced without increasing the loss, thereby making the filter case 1 small in size. At the same time, the filter characteristic is improved by making the space small. In the conventional filter shown in FIG. 11, a space between the filter substrate 101 and the aluminum cover 107 is 8–14 mm when the filter is used as a distributed parameter filter under an 800 MHz band. In this case, the filter characteristic cannot be ideal because a jumped coupling between resonators increases due to the larger space. As opposed to this, the filter characteristic of the present embodiment is greatly improved, because the space between the substrates is about 6 mm, thereby suppressing the jumped coupling while keeping a good coupling between neighboring resonators. The space between the substrates may be further reduced to a level of 1–3 mm. In this case, the filter characteristic is drastically improved by further lowering the jumped coupling and compensating decrease of the coupling between neighboring resonators by reducing the distance therebetween. On the other hand, when the space between the substrates in this embodiment is made at the same level as that of the conventional filter, the ground plane 21b may be made by forming a gold thin film electrode covering a whole surface of the superconductor.

The soft metal foil 21d between the frame (1a–1d) and the substrate (2a–2d) may be discretely interposed at places where the mounting springs 3a are located, or continuously formed either on the frame or the substrate before mounting the substrate on the frame. Alternatively, the soft metal foil 21d may be formed as a bump. The gold electrode film 21c may be formed continuously on the ground plane 21b at its periphery as in the embodiment described above. Alternatively, it may be discretely formed at places where the mounting springs 3a are located.

Figure 5:
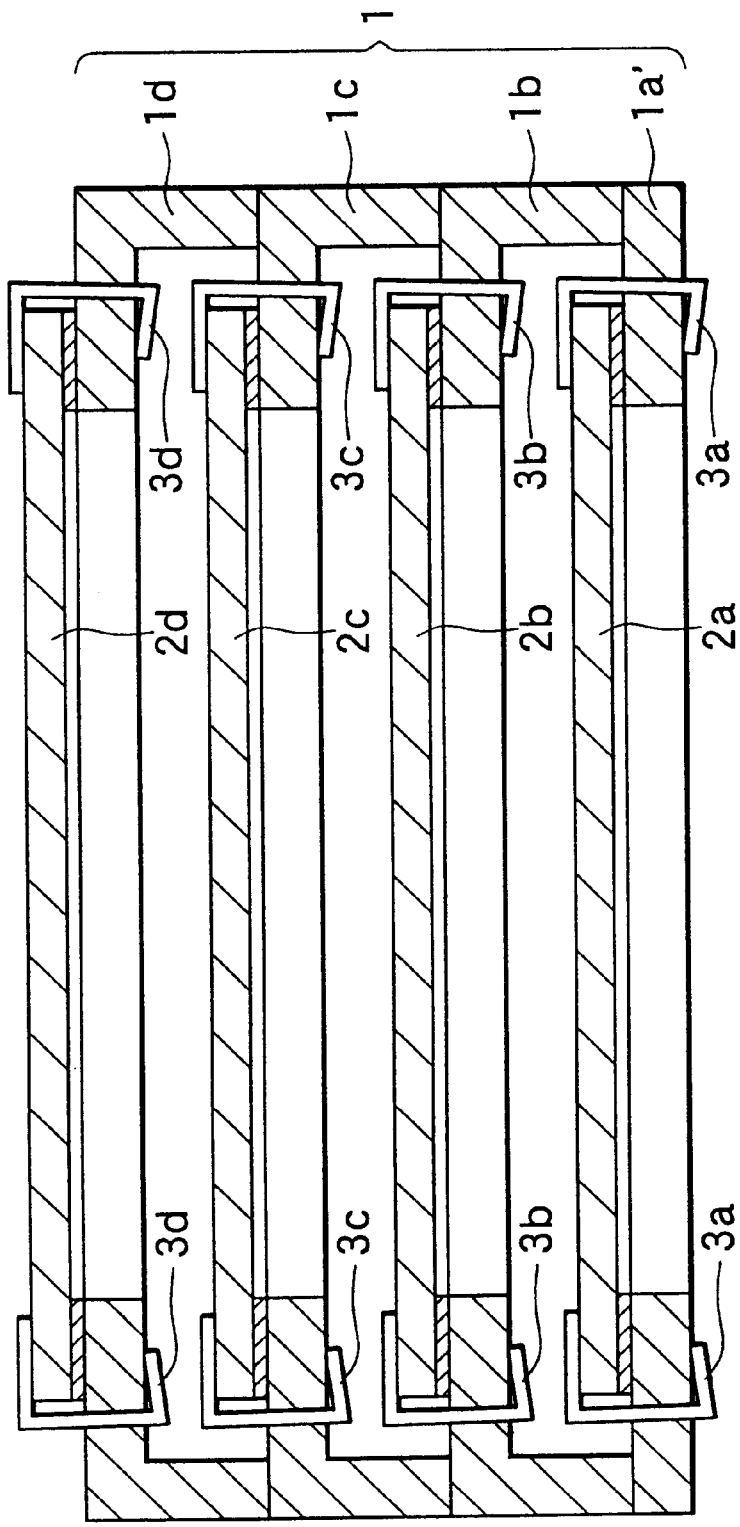
FIG. 5 is a cross-sectional view showing a modification of the mounting structure shown in FIG. 1.
Figure 6:
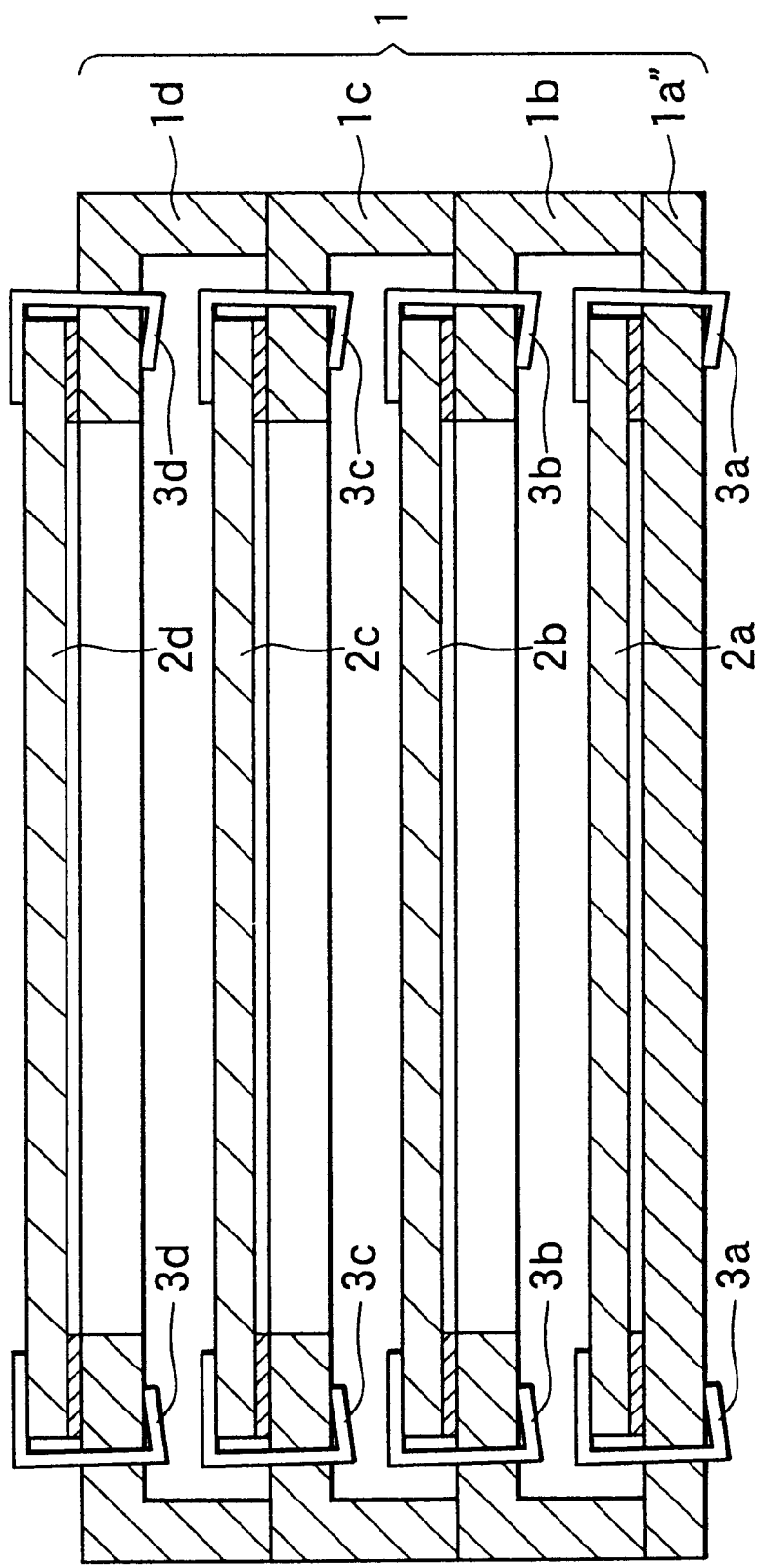
FIG. 6 is a cross-sectional view showing a modification of the mounting structure shown in FIG. 5.

The frame 1a of the first filter unit (the bottom filter unit) may be replaced by a frame 1a' shown in FIG. 5. The frame 1a' is a flat plate having the opening 11e but no vertical portion. The frame 1a' may be further replaced by a frame 1a" shown in FIG. 6. The frame 1a" is just a flat plate having no opening. In this case, the heat dissipation plate 4 may be attached to the frame 1a" to which the cold head 5 is connected. In addition, the frame 1a" having no opening is able to function also as a shielding member.

A shielding film made of a superconductor or metallic material may be formed on the upper surface of the cover plate 2d which has no resonator pattern. The shielding film further enhances the shielding effect. Since the ground plane 21b formed on the lower surface of the cover plate 2d is grounded, the shielding effect under a high frequency is improved without grounding the shielding film formed on the upper surface.

Figure 7:
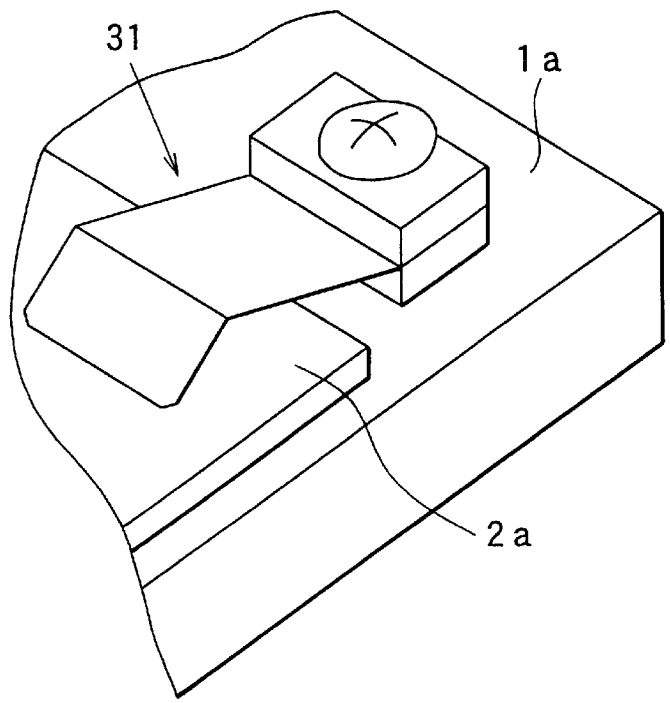
FIG. 7 is a perspective view showing a modified form of mounting a substrate on a frame.
Figure 8:
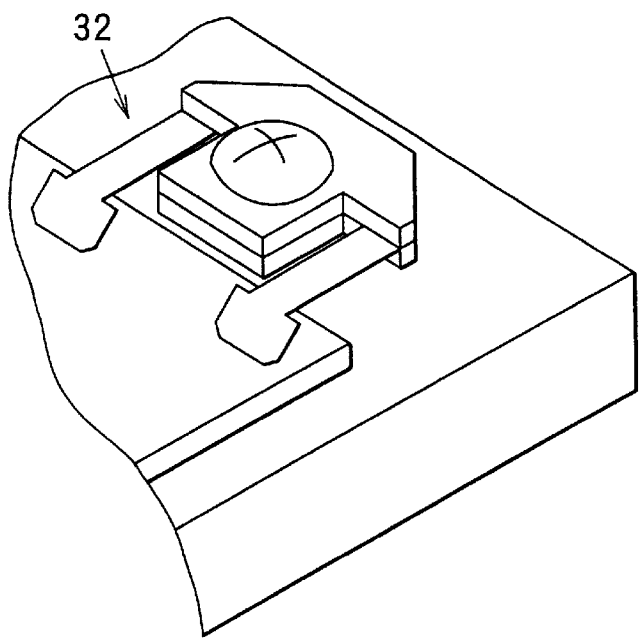
FIG. 8 is a perspective view showing another modified form of mounting a substrate on a frame.
Figure 9:
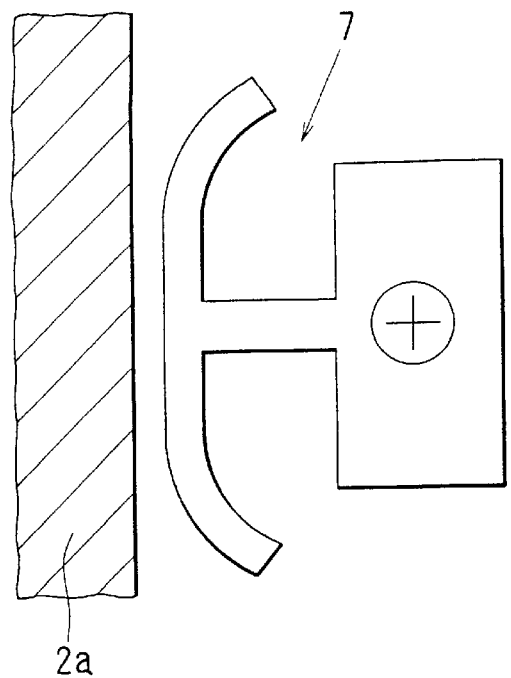
FIG. 9 is a schematic view showing a stopper for restricting a displacement of a substrate relative to a frame.

Though the substrate (2a–2d) is mounted on the frame (1a–1d) by the mounting spring 3a in the embodiment described above, it may be mounted in various manners. For example, the substrate may be mounted by using a mounting plate 31 as shown in FIG. 7. The mounting plate 31 is made to have a spring action pushing down the substrate against the frame and fixed to the frame at its one end by a screw. To save a space for fixing the mounting plate 31, the mounting plate 31 may be replaced by a mounting plate 32 shown in FIG. 8. The substrate is mounted on the frame by pressing the substrate against the frame by spring (3a, 31 or 32) to allow a certain sliding movement caused by thermal expansion difference between the substrate and the frame. To restrict excessive movement of the substrate relative to the frame, a stopper 7 shown in FIG. 9 may be used. The stopper 7 is fixed to the frame by a screw and has rounded corners to avoid a concentrated stress at its corners when the substrate contacts the stopper 7. It is preferable that the stopper 7 has some flexibility.

Though the input/output terminal of the resonator pattern 21a is connected to the connector 6 by wire-bonding or ribbon-bonding in the embodiment described above, they may be slidably connected to each other or by using a sliding connector.

Figure 10:
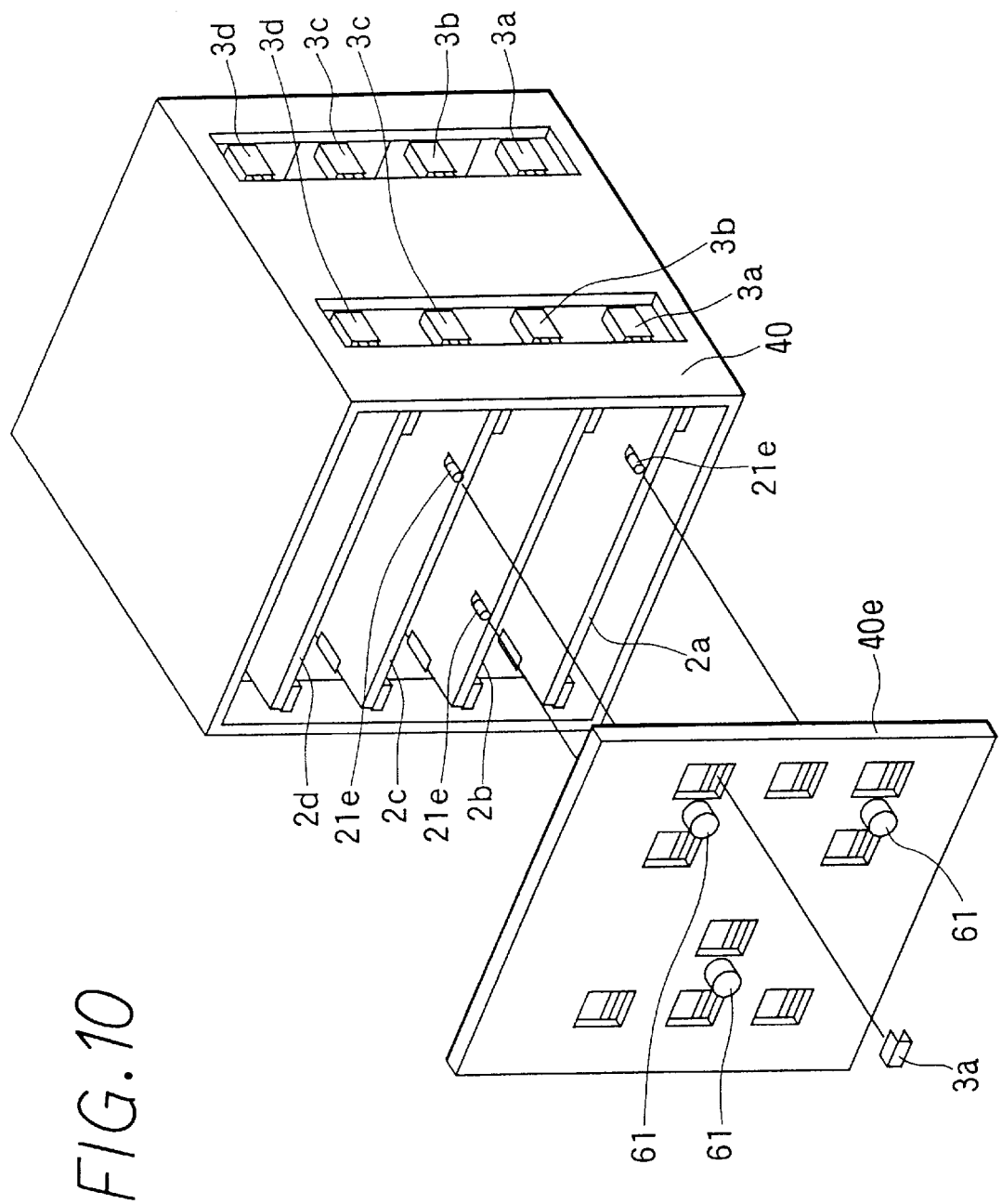
FIG. 10 is a perspective view showing another example of the mounting structure according to the present invention.
Figure 12:
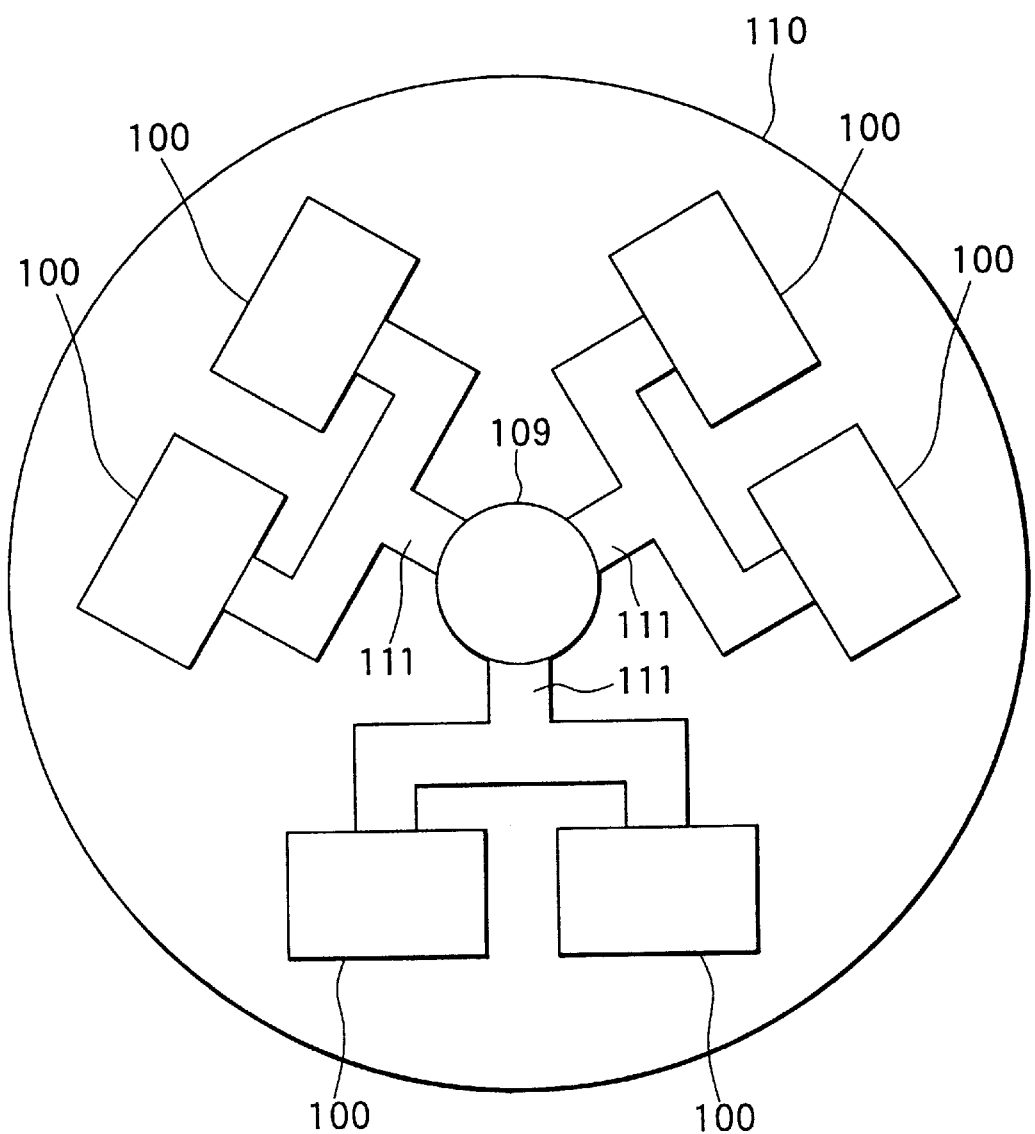
FIG. 12 is a plan view showing a conventional structure for containing plural superconducting filters in a container.

Though a plurality of filter units are stacked on one another in the embodiment described above, a plurality of substrates each having the superconductor resonator pattern 21a and the ground plane 21b may be contained in a box-like container 40, as shown in FIG. 10. The box-like container 40 has openings at both sides which are closed by side plates 40e after the substrates (2a–2d) are mounted in the container 40. The substrates are mounted in the container 40 by mounting springs (3a–3d). Input/output terminals 21e are formed on each substrate, and SMA connectors 61 to be slidably connected to the input/output terminals 21e are disposed on the side plate 40e. The terminals 21e and the connectors 61 are slidably connected to each other when the side plate 40e closes the opening of the container 40. After the opening is closed by the side plate 40e, the substrates are further fastened by the mounting springs 3a through windows formed on the side plate 40e. Windows for inserting the mounting springs 3a formed on the container 40 and the side plate 40e are covered by a conductive material (not shown), so that shielding effect is not reduced by the windows. To cool down the substrates carrying superconductor resonator patterns thereon, the heat dissipation plate 4 is attached to one side of the container 40, and the cold head 5 is connected to the heat dissipation plate 4 in the same manner as in the foregoing embodiment.

The substrate having a superconductor pattern or the case including such plural substrates is operated under vacuum. However, it may be operated in a space filled with inert gas or air. The mounting structure of the present invention may be applied to superconductor circuits other than the superconductor filter circuit.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A mounting structure of a superconducting circuit comprising:

a plurality of substrates, each substrate having a superconducting circuit formed on an upper surface thereof and a ground plane formed on a lower surface thereof; and a case for mounting a plurality of the substrates, wherein:

the substrates are stacked on one another with a space therebetween and mounted on the case so that the superconducting circuit formed on the upper surface of one substrate faces the ground plane fromed on the lower surface of another substrate which is stacked above the one substrate.

2. The mounting structure of a superconducting circuit as in claim 1, wherein:

the case includes a plurality of frames disposed in the case with a space therebetween, the frame having an opening; and each of the substrates is mounted on each of the frames so that the ground plane of one substrate is exposed to the opening of the frame and faces the superconducting circuit of another substrate mounted below the one substrate.

3. The mounting structure of a superconducting circuit as in claim 2, wherein:

each of the substrates is mounted on each of the frames so that the ground plane of the substrate closely contacts the frame electrically and thermally.

4. The mounting structure of a superconducting circuit as in claim 1, wherein:

the substrate is mounted on the case with a soft metal foil interposed therebetween.

5. The mounting structure of a superconducting circuit as in claim 1, wherein:

the ground plane is made of a superconducting material.

6. The mounting structure of a superconducting circuit as in claim 5, wherein:

the substrate mounted on the case at an upper most position is a cover plate which has no superconducting circuit on the upper surface thereof but has the ground plane on the lower surface thereof.

7. A mounting structure of a superconducting circuit comprising:

a cover unit comprising a frame having an opening and a substrate mounted on the frame, the substrate having a superconductor ground plane formed on a lower surface thereof, the ground plane being exposed to the opening of the frame;

a plurality of intermediate units each comprising a frame having an opening and a substrate mounted on the frame, the substrate having a superconductor pattern formed on an upper surface thereof and a superconductor ground plane formed on a lower surface thereof, the ground plane being exposed to the opening of the frame; and a bottom unit comprising a flat plate and a substrate mounted on the flat plate, the substrate having a superconductor pattern formed on an upper surface thereof and a superconductor ground plane formed on a lower surface thereof, wherein:

the bottom unit, the intermediate units and the cover unit are stacked on one another upwardly in this order with a space therebetween, thereby forming a unitary case; and the superconductor ground plane formed on one substrate faces the superconductor pattern formed on another substrate mounted underneath the one substrate.

8. The mounting structure of a superconducting circuit as in claim 7, wherein:

the flat plate of the bottom unit has no opening and serves as a shielding member as a whole.

9. The mounting structure of a superconducting circuit as in claim 7, wherein:

a shielding layer is formed on the upper surface of the substrate of the cover unit.

10. A mounting structure of a superconducting circuit comprising:

a plurality of units each comprising a frame having an opening and a substrate mounted on the frame, the substrate having a superconductor pattern formed on an upper surface thereof and a superconductor ground plane formed on a lower surface thereof, the ground plane being exposed to the opening of the frame, the ground plane closely contacting the frame electrically and thermally; wherein:

a plurality of the units are stacked on one another with a space therebetween; and the superconductor ground plane formed on one substrate faces, with a space, the superconductor pattern formed on another substrate mounted underneath the one substrate.

11. The mounting structure of a superconducting circuit as in claim 10, wherein:

the frame includes a connector plate for mounting a connector which is connected to an input/output terminal of the superconductor pattern, the connector plate extending upwardly from the frame; and the frame further includes a recessed space which is open downwardly so that the recessed space accommodates the input/output terminal extending from the other frame mounted underneath the frame.

12. The mounting structure of a superconducting circuit as in claim 10, wherein:

the substrate is mounted on the frame by pressing down the substrate against the frame by mounting springs.

* * * * *